(12) United States Patent  
Kameyama et al.

(10) Patent No.: US 6,677,797 B2
(45) Date of Patent: Jan. 13, 2004

(54) SEMICONDUCTOR INTEGRATED CIRCUIT

(75) Inventors: Atsushi Kameyama, Tokyo (JP); Tsuneaki Fuse, Tokyo (JP); Masako Yoshida, Yokohama (JP); Kazunori Ohuchi, deceased, late of Yokohama (JP), by Sachiko Ohuchi, legal representative

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/023,947

(22) Filed: Dec. 21, 2001

(65) Prior Publication Data
US 2002/0080663 A1 Jun. 27, 2002

(30) Foreign Application Priority Data
Dec. 26, 2000 (JP) ........................................ 2000-395932

(51) Int. Cl.[7] ................................................ H03L 5/00
(52) U.S. Cl. ........................ 327/333; 327/544; 327/403; 327/404; 326/80; 326/81
(58) Field of Search ................................. 327/544, 333, 327/403, 407, 404, 81; 326/38, 40, 41, 80

(56) References Cited
U.S. PATENT DOCUMENTS

| | | | | |
|---|---|---|---|---|
| 5,627,492 A | * | 5/1997 | Weaver et al. | 327/544 |
| 5,751,164 A | * | 5/1998 | Sharpe-Geisler et al. | 326/38 |
| 6,087,893 A | | 7/2000 | Oowaki et al. | 327/537 |
| 6,177,811 B1 | | 1/2001 | Fuse et al. | 326/119 |

* cited by examiner

Primary Examiner—Tuan T. Lam
Assistant Examiner—Hiep Nguyen
(74) Attorney, Agent, or Firm—Oblon, Spivak, McClelland, Maier & Neustadt, P.C.

(57) ABSTRACT

An integrated circuit has first and second logic circuits having common input terminals and the same complementary logic function. The first logic circuit has a p-type FET circuit block and an n-type FET circuit block each with a high threshold value, while the second logic circuit has a p-type FET circuit block and an n-type FET circuit block each with a low threshold value. An output switch circuit intervenes between the p-type FET and n-type FET circuit blocks in each logic circuit and controls the power supply connection to each logic circuit. In operation, the output of the second logic circuit is connected to the output terminal to realize a low power consumption. In the standby state, the output of the first logic circuit is connected to the output terminal to realize a low leakage current.

18 Claims, 13 Drawing Sheets

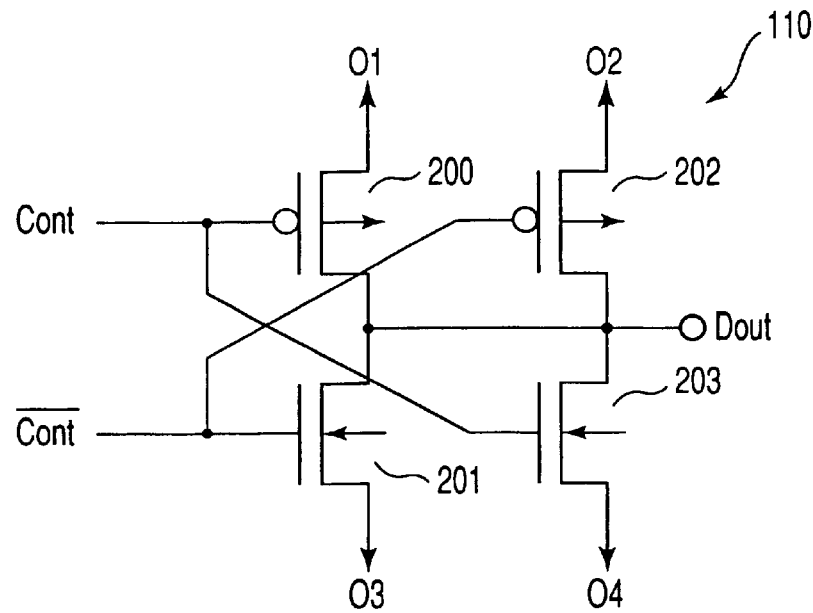
F I G. 5
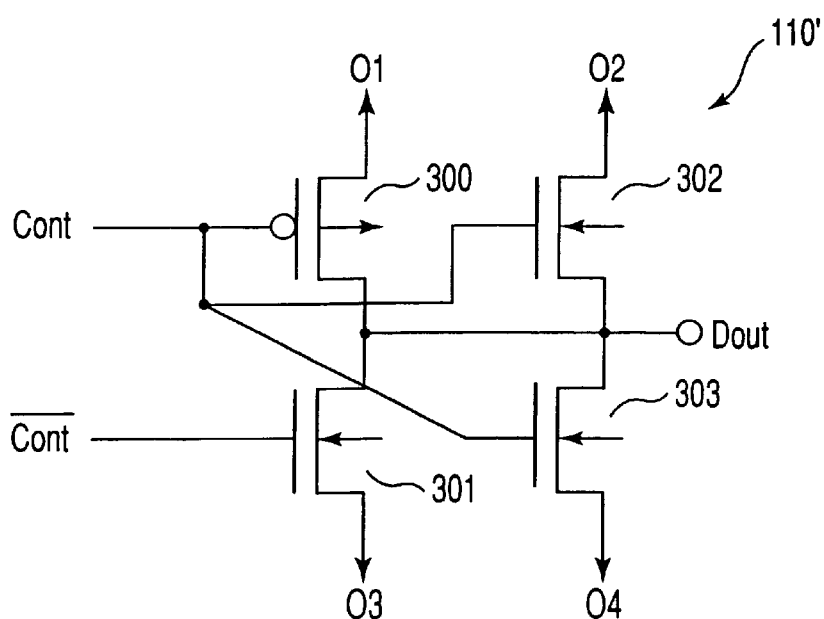
F I G. 6

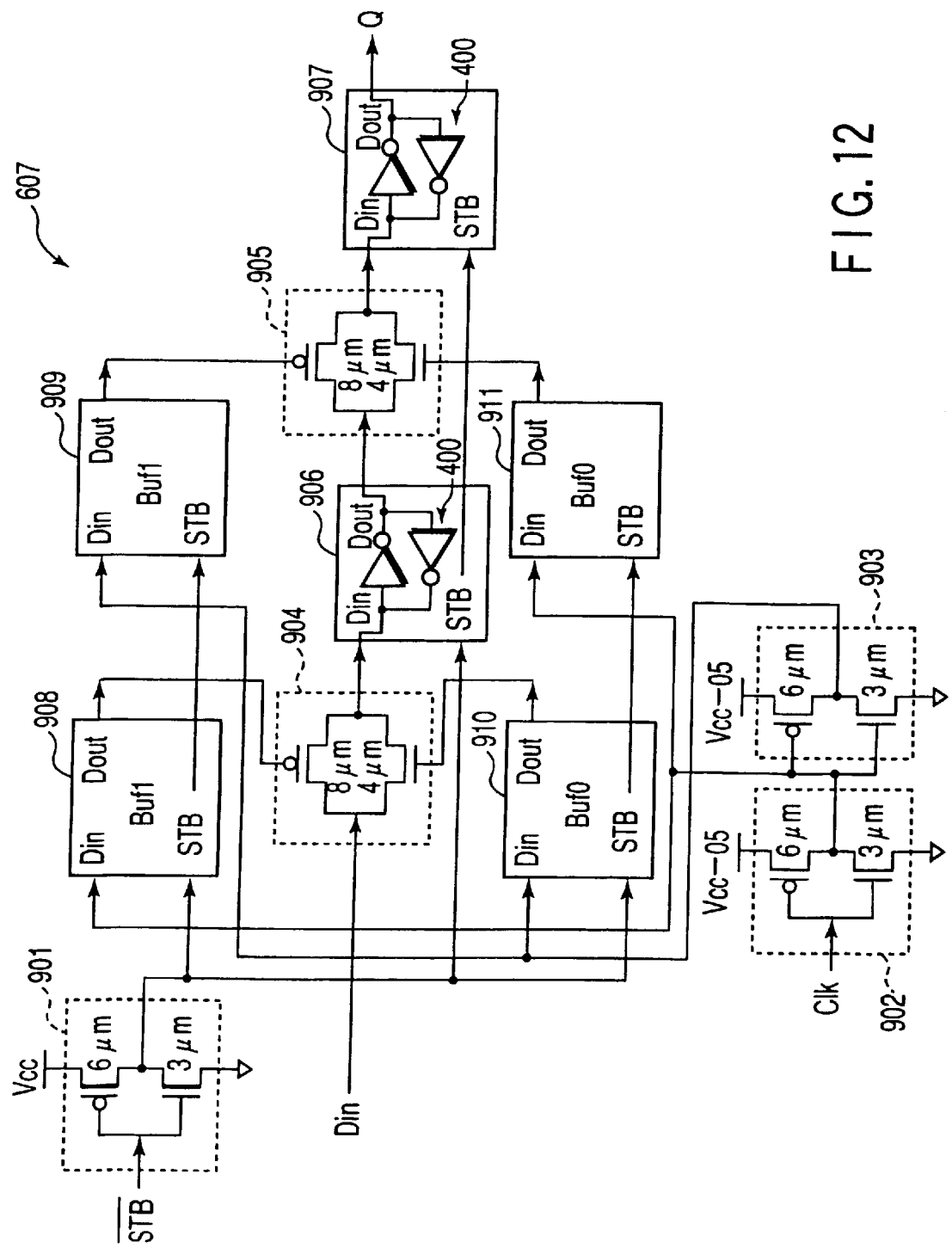
F I G. 12

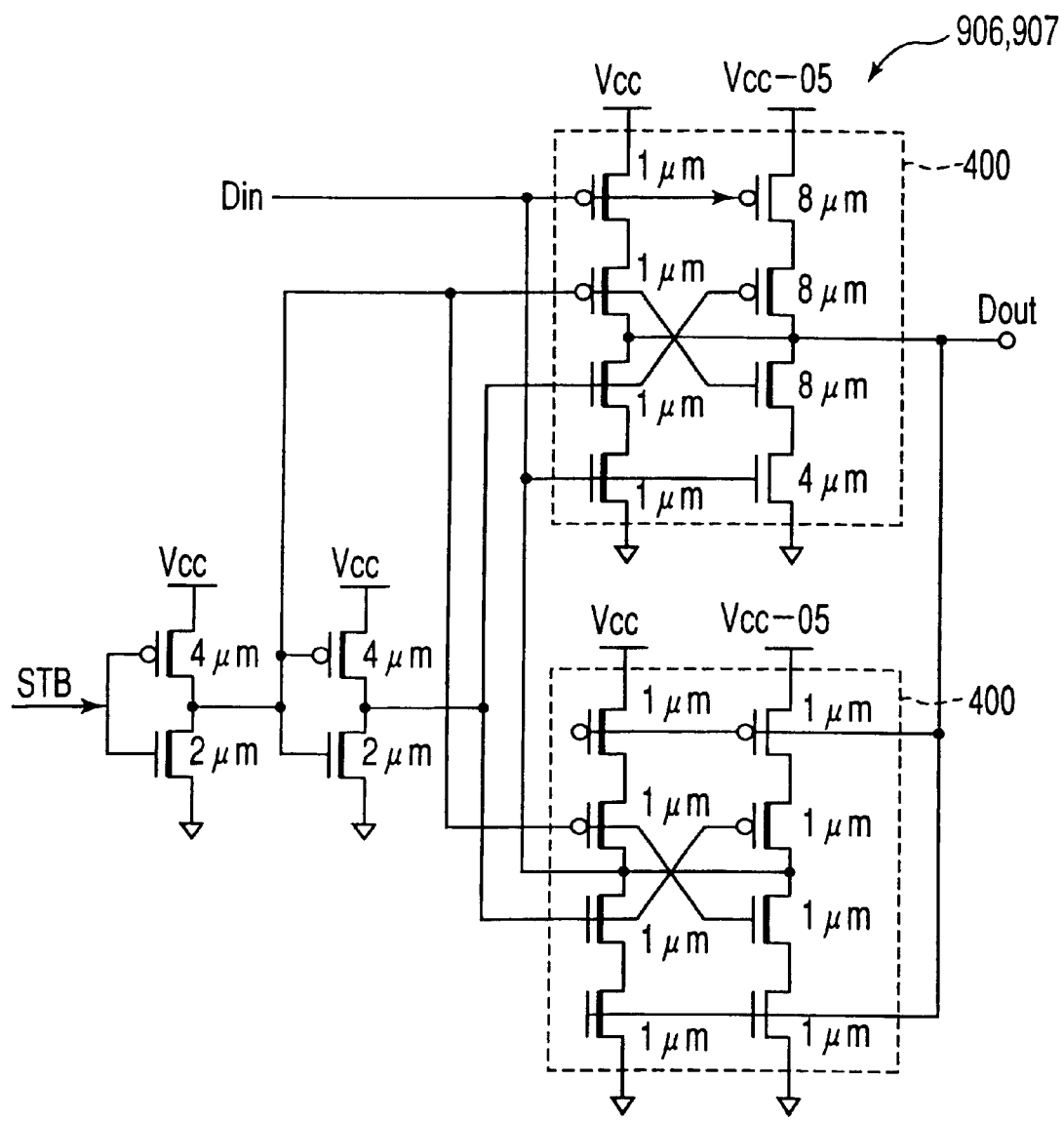
F I G. 13

SEMICONDUCTOR INTEGRATED CIRCUIT

CROSS-REFERENCE TO RELATED APPLICATIONS

This application is based upon and claims the benefit of priority from the prior Japanese Patent Application No. 2000-395932, filed Dec. 26, 2000, the entire contents of which are incorporated herein by reference.

BACKGROUND OF THE INVENTION

1. Field of the Invention

This invention relates to a semiconductor integrated circuit which has a plurality of power supply levels and causes logic circuits to operate on a very low power supply voltage, and more particularly to a semiconductor integrated circuit provided with an operating circuit and a standby circuit.

2. Description of the Related Art

In recent years, the packing density of semiconductor integrated circuits has increased remarkably. In semiconductor memory devices of the order of gigabits, hundreds of millions of semiconductor elements have been squeezed into a single chip. In a 64-bit microprocessor, millions of to tens of millions of semiconductor elements have been squeezed into a single chip. The improvement of the packing density has been achieved by the miniaturization of elements. In a 1-Gbit DRAM (Dynamic Random Access Memory), MOS transistors with a gate length of 0.15 μm have been used. In a DRAM with a much higher packing density, MOS transistors with a gate length of 0.1 μm or less will be used.

In such very small MOS transistors, the characteristics of the transistors deteriorate due to the generation of hot carriers, or the breakdown of the insulating films occurs due to TDDB (Time-Dependent Dielectric Breakdown). When the concentration of impurities in the substrate region or other regions is increased to suppress a drop in the threshold voltage due to the gate length getting shorter, the junction voltage of the source and drain drops.

To maintain the reliability of these fine elements, it is important to drop the power supply voltage. That is, the generation of hot carriers is prevented by weakening the horizontal electric field between the source and drain, and TDDB is prevented by weakening the vertical electric field between the gate and bulk. Moreover, dropping the power supply voltage decreases the reverse bias applied to the junction between the source and bulk and to the junction between the drain and bulk, thereby coping with a drop in the breakdown voltage.

In mobile information apparatus, whose market has been expanding rapidly in recent years, a lightweight power supply with a high energy density, such as a lithium ion battery, has been widely used. Since the voltage of the lithium ion battery is about 3 V, it is higher than the breakdown voltage of the very small MOS transistor. Therefore, when the lithium ion battery is applied to a circuit using very small transistors, it is necessary to drop its voltage using a DC-DC voltage converter. Since the power consumption of the CMOS circuit used in a logic circuit is proportional to the operating frequency and further proportional to the square of the power supply voltage, lowering the power supply voltage has a significant effect on the decrease of the chip power consumption.

Using mobile information apparatus for a longer time requires a battery with high energy density, a DC-DC converter with high efficiency, and an integrated circuit operating on a low voltage. From the viewpoint of reducing the power consumption of an LSI, it is desirable to use a stepped-down power supply voltage particularly in a microprocessor or baseband LSI which consumes a lot of power.

On the other hand, the mobile information apparatus requires memory elements, such as DRAMs or SRAMs (static random access memories) as well as the logic circuits. In DRAMs, the first subject is to secure a sufficient amount of charge in the cells to increase resistance to errors due to software. In SRAMs, the first subject is to avoid the deterioration of speed when they are operating on low power supply voltages. Therefore, in DRAMs and SRAMs, the power consumption has not been reduced remarkably as found in logic circuits. Presently, elements operating on a power supply voltage of about 1.5 V have been put to practical use.

The power supply voltage of about 1.5 V, however, is much higher than the lowest voltage on which the logic circuits can operate. For this reason, it is conceivable that an LSI including both memory circuits and logic circuits takes and will take a multi-power-supply configuration that supplies various power supply voltages according to each circuit section.

FIG. 1 shows a semiconductor integrated circuit for mobile information apparatus obtained by integrating a memory circuit and a logic circuit into a single chip and the configuration of its power supply. The power supply system is composed of a lithium ion battery 1700 and a DC-DC voltage converter 1701. The semiconductor integrated circuit 1704 is composed of a logic circuit 1702 and an on-chip memory circuit 1703.

More specifically, 3 V from the lithium ion battery 1700 is converted by the DC-DC voltage converter 1700 into a voltage of 0.5 V. The 0.5-V power supply is supplied to the logic circuit 1702. On the other hand, since the on-chip memory circuit 1703 generally needs a power supply voltage of 1.5 to 2.0 V or higher for high speed operation, the 3-V power supply of the lithium ion battery 1700 is supplied to the memory circuit 1703.

With the configuration of FIG. 1, dropping the power supply voltage of the logic circuit from 3 V to about 0.5 V enables the power consumption in operation to be decreased theoretically by about 95%, which reduces the power consumption dramatically.

However, when the power supply voltage of a CMOS circuit operating on a power supply voltage usually ranging from 3 V to 2 V is dropped, since the threshold voltage is high as it is, there arises a problem: the operating speed of the elements decreases or they do not operate.

To solve this problem, the threshold voltage of the MOS transistors is dropped as the power supply voltage drops. For example, to configure a logic circuit operating on a low power supply voltage of 0.5 V, it is necessary to use a MOSFET whose threshold voltage is about 0.1 to 0.15 V in absolute value, about one-third of the threshold voltage of a conventional MOSFET.

With such a low threshold voltage, however, if the S factor that determines the sub-threshold characteristic of, for example, a MOSFET is 100 mV/decade, the leakage current when the MOSFET is off increases significantly by about three orders of magnitude.

Consequently, in an approach of only lowering the power supply, the power consumption in operation can be decreased, whereas the power consumption in the standby state of the apparatus increases significantly. Therefore, the semiconductor integrated circuit is unsuitable for mobile information apparatus as it is.

FIG. 2 shows a known semiconductor integrated circuit configured to overcome the above problem. A power supply voltage converter 1801 converts 3 V from a lithium ion battery 1800 into a voltage of 0.5 V to supply the voltage as low as 0.5 V to a semiconductor integrated circuit 1805 including a logic circuit 1802, thereby reducing the power consumption in operation.

The semiconductor integrated circuit 1805 further comprises a positive power supply voltage generator 1803 and a negative power supply voltage generator 1804 and generates a potential higher than the power supply voltage at the positive power supply voltage generator 1803 and a potential lower than the ground potential at the negative power supply voltage generator 1804. The semiconductor integrated circuit is configured to supply the potentials generated at the voltage generators to the n-well and p-well (now shown) in the logic circuit 1802, thereby making somewhat lower the absolute value of the threshold voltage of the MOSFET in the logic circuit in normal operation to give priority to the operating speed.

With the configuration of FIG. 2, the power consumption can be reduced by making larger the absolute value of the threshold voltage of the MOSFET in the logic circuit in the standby state to decrease the leakage current when the MOSFET is off. By this technique, however, when the voltage is very low as in the 0.5-V power supply, the following problem arises.

In the semiconductor integrated circuit, a charge pump method is generally used in the positive power supply voltage generator 1803 and negative power supply voltage generator 1804. At a very low voltage from, for example, the 0.5-V power supply, an ordinary charge pump method cannot provide a sufficient driving capability to control the well potential. An attempt to increase the driving capability makes the size of the driving MOSFET very large, with the result that the layout area of the voltage generators is larger than that of conventional equivalents.

FIG. 3 is a diagram to help explain a leakage current problem occurring in the off state. In FIG. 3, three kinds of power supply are supplied to a semiconductor integrated circuit 1905. Specifically, a 3-V power supply (VDD) supplied from a nickel-hydrogen battery 1900 and the ground potential (VSS) are connected to a logic circuit 1902 integrated in an on-chip manner in the semiconductor integrated circuit. In addition, a logic circuit power supply VD1 (0.5 V) supplied from a power supply voltage converter 1901 is connected via a pMOSFET 1093 with a high threshold value to a logical circuit power supply line VDDV.

With the configuration of FIG. 3, after the necessary information in the logic circuit is saved in a memory circuit 1904 in the standby state, the gate voltage (/STB) of the pMOSFET 1903 is made VDD and the MOSFET 1903 is brought into the off state. At that time, the leakage current is determined at a very small value by the off characteristic of the pMOSFET 1903 with a high threshold value.

However, since the power supply of the logic circuit 1902 is turned off in the standby state, the procedure for saving the information in the flip-flop of the logic circuit to the memory circuit in advance as described in reference (1 V Power Supply High-Speed Digital Circuit technology with Multi Threshold-Voltage CMOS by S. Mutch et al., 1995 IEEE Journal of Solid State Circuits, Vol. 30 No. 8).

Furthermore, when the logic circuit is large in size and consumes a lot of power, it is necessary to reduce the effect of a drop in the potential due to the ON resistance of the switching transistor pMOSFET 1903 for cutting off current on the circuit stability and speed characteristic of the logic circuit block. This makes the element size of the pMOSFET 1903 very large.

As a result, in addition to the problem of the larger layout area of the circuit that causes the pMOSFET 1903 to switch on and off the power supply, there arises another problem: the power consumption of the driver circuit that drives the gate of the pMOSFET 1903 becomes higher.

Therefore, in the logic circuit, it is necessary to make the low power consumption characteristic in the operating state compatible with the low power consumption characteristic in the standby state. Meeting this requirement by a known proposed method requires a large-scale circuit for switching, making the layout area larger, which leads to an increase in the cost of the semiconductor integrated circuit.

When the logic circuit is large in scale, it takes some time to do switching. To make the switching faster, it is necessary to increase the driving capability of the peripheral driving circuit, which leads to an increase in the power consumption. Moreover, holding the information in the flip-flop of the logic circuit needs an additional circuit, which increases the layout area.

Therefore, in conventional semiconductor integrated circuits for mobile apparatus, there have been strong demands toward realizing a lower power consumption in the operating and standby states, while meeting the operating speed specification.

Methods of making lower the power consumption in the standby state include a well potential control method of generating a voltage higher than the power supply voltage of the logic circuit in the semiconductor integrated circuit and a potential lower than the ground potential on the chip and thereby controlling the well potential and a power supply switching method of constructing a power supply switch using FETs with good off characteristics.

Although these methods are effective in making the standby power consumption lower, use of a very low power supply voltage of about 0.5 V to lower the operating power consumption causes the following problems:

(1) In the well potential control method, the layout area increases to compensate for a decrease in the driving capability due to the lower power supply voltage of the potential generator.

(2) In both of the well potential control method and power supply switch method, the power consumption by the standby control circuit increases in high-speed operation or in the operation of switching to the standby state.

(3) In the power supply switching method, a drop in the power supply voltage due to the power supply switch FET impairs the stability of the circuit and degrades the speed characteristic.

(4) In the standby state in the power supply switching method, an additional circuit for holding data is needed.

These problems make the layout area larger, increases the power consumption, and complicates the design more, which results in an increase in the cost of the integrated circuit.

For this reason, such a semiconductor integrated circuit has been desired as is capable of realizing a lower power consumption in both the operating and standby states in a logic circuit operating on a very low power supply voltage of about 0.5 V without using a complex control circuit.

BRIEF SUMMARY OF THE INVENTION

According to a first aspect of the present invention, there is provided a semiconductor integrated circuit comprising: a first logic circuit which has a first input terminal and comprises a logic block that essentially connects a first pMIS logic block made up of a pMISFET with a threshold voltage of Vtp1 and a first nMIS inverted-logic block made up of an nMISFET with a threshold voltage of Vtn1 in series between a first power supply with a potential of V1 and a reference potential; a second logic circuit which has a second input terminal connected to the first input terminal and which has the same logic function as that of the first logic circuit and comprises a logic block that essentially connects a second pMIS logic block made up of a pMISFET with a threshold voltage of Vtp2 (Vtp2<Vtp1) and a second nMIS inverted-logic block made up of an nMISFET with a threshold voltage of Vtn2 (Vtn2<Vtn1) in series between a second power supply with a potential of V2 (V2<V1) and the reference potential; and an output switch circuit which intervenes between the first pMIS logic block and the first nMIS inverted-logic block in the first logic circuit and between the second pMIS logic block and the second nMIS inverted-logic block in the second logic circuit and which has a control signal terminal to which a control signal is inputted and an output terminal that switches between an output of the first logic circuit and an output of the second logic circuit according to the control signal.

According to a second aspect of the present invention, there is provided a semiconductor integrated circuit comprising: a first logic circuit which has a first input terminal and comprises a logic block that essentially connects a first pMIS logic block made up of a pMISFET with a threshold voltage of Vtp1 and a first nMIS inverted-logic block made up of an nMISFET with a threshold voltage of Vtn1 in series between a first power supply with a potential of V1 and a reference potential; a second logic circuit with a second input terminal which has a different logic function from that of the first logic circuit and which comprises a logic block that essentially connects a second pMIS logic block made up of a pMISFET with a threshold voltage of Vtp2 (Vtp2<Vtp1) and a second nMIS inverted-logic block made up of an nMISFET with a threshold voltage of Vtn2 (Vtn2<Vtn1) in series between a second power supply with a potential of V2 (V2<V1) and the reference potential; and an output switch circuit which intervenes between the first pMIS logic block and the first nMIS inverted-logic block in the first logic circuit and between the second pMIS logic block and the second nMIS inverted-logic block in the second logic circuit and which has a control signal terminal to which a control signal is inputted and an output terminal that switches between an output of the first logic circuit and an output of the second logic circuit according to the control signal.

BRIEF DESCRIPTION OF THE SEVERAL VIEWS OF THE DRAWING

FIG. 5 is a circuit diagram of the output switch circuit used in the first embodiment;

FIG. 6 is another circuit diagram of the output switch circuit used in the first embodiment;

FIG. 12 is a block diagram of a master-slave flip-flop according to a second embodiment of the present invention;

FIG. 13 is a circuit diagram showing a configuration of the latch circuit 906 or 907 used in FIG. 12;

DETAILED DESCRIPTION OF THE INVENTION

Hereinafter, referring to the accompanying drawings, embodiments of the present invention will be explained.

First Embodiment

Figure 4:
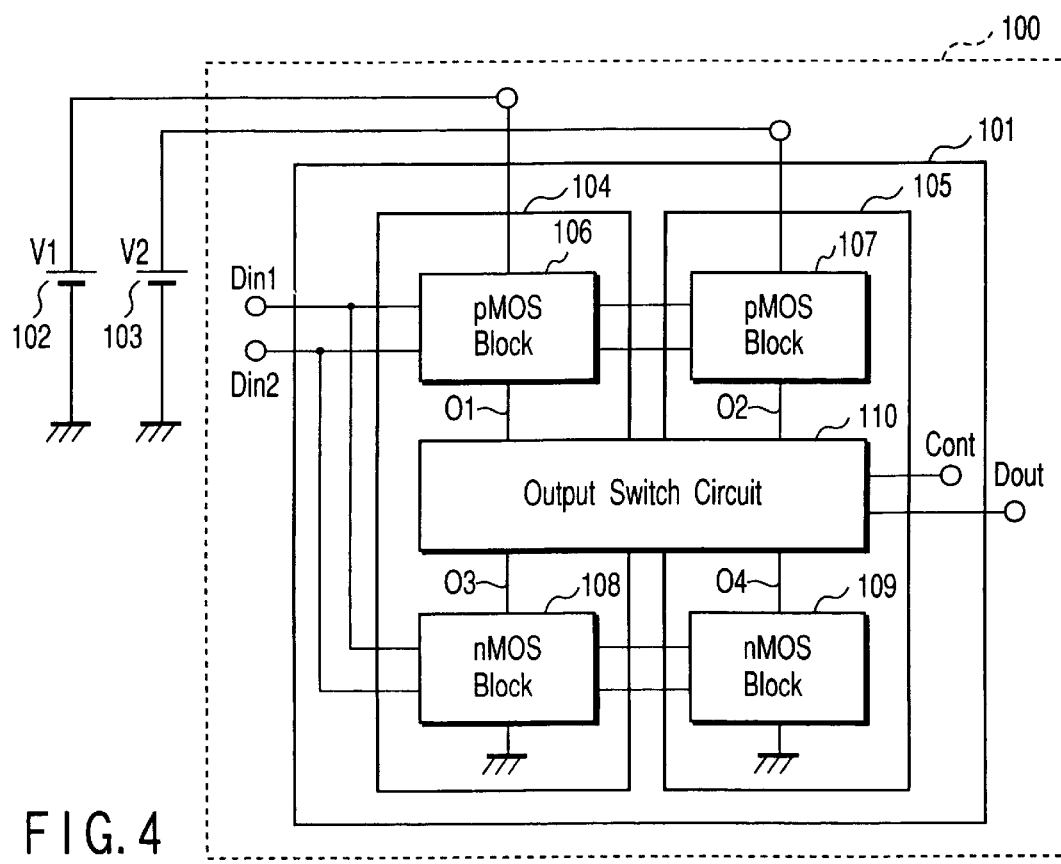
FIG. 4 is a block diagram showing the basic configuration of a semiconductor integrated circuit according to a first embodiment of the present invention.

FIG. 4 is a block diagram showing the basic configuration of a semiconductor integrated circuit 100 according to a first embodiment of the present invention.

Two power supplies 102 and 103, which fulfill the expression V1>V2, supply voltages not only to the semiconductor integrated circuit 100 but also to an internal logic circuit 101.

The internal logic circuit 101 is composed of a first and a second logic circuit 104 and 105, which have the same logic function. The first logic circuit 104 includes a pMOS circuit block 106 and an nMOS circuit block 108 having a complementary logic to the pMOS circuit block 106. The second logic circuit 105 includes a pMOS circuit block 107 and an nMOS circuit block 109 having a complementary logic characteristic to the pMOS circuit block 107. The output terminals O1 to O4 of the respective blocks are connected to an output terminal Dout via an output switch circuit 110 which effects switching according to a control signal Cont applied to the control terminal of the switch circuit 110.

In the first embodiment, when the semiconductor integrated circuit 100 is in operation, the control signal Cont connects the output terminals O2 and O4 of the pMOS circuit block 107 and nMOS circuit block 109 to the output terminal Dout, thereby achieving a low power consumption operation at a low voltage.

On the other hand, since the pMOS circuit block 106 and nMOS circuit block 108 are electrically floated by the output switch circuit 110, the leakage route of current disappears in the first logic circuit 104.

Next, when the semiconductor integrated circuit is in the standby state according to the control signal Cont, an output switching signal connects the output terminals O1 and O3 of the pMOS circuit block 106 and nMOS circuit block 108 in the first logic circuit 104 to the output terminal Dout. Since both of the pMOS circuit block 106 and nMOS circuit block 108 are composed of transistors whose threshold voltages have relatively large absolute values, the first logic circuit 104 has a low leakage current characteristic.

At this time, because the pMOS circuit block 107 and nMOS circuit block 109 in the second logic circuit 105 are electrically floated by the output switch circuit 110, the second logic circuit 105 has a low leakage current characteristic, regardless of the threshold voltages of the FETs constituting the pMOS circuit block 107 and nMOS circuit block 109. Therefore, the semiconductor integrated circuit presents a low power consumption characteristic at the low power supply voltage when it is in operation, whereas it presents a low leakage current characteristic when it is in the standby state.

FIG. 5 shows a concrete example of the output switch circuit 110 used in the first embodiment. The drains of pMOSFETs 200 and 202 and nMOSFETs 201 and 203 are connected to the output terminal Dout. The sources of the pMOSFETs 200 and 202 and nMOSFETs 201 and 203 are connected to the output terminals O1 to O4 of the pMOS circuit blocks 106 and 107 and nMOS block circuits 108 and 109 in FIG. 4, respectively.

Then, the control signal Cont is supplied to the gates of the pMOSFET 200 and nMOSFET 203 and the complementary signal /Cont of the control signal Cont is supplied to the gates of the pMOSFET 202 and nMOSFET 201. With this configuration, not only can the output of one logic circuit be connected to the output terminal Dout, but the output of the other logic circuit can also be electrically floated.

FIG. 6 shows another concrete example of the output switch circuit 110 used in the first embodiment. The drains of pMOSFET 300 and nMOSFETs 301, 303 and the source of the nMOSFET 302 are connected to the output terminal Dout. The sources of the MOSFTTs 300, 301 and 303 are connected to the output terminals O1, O3 and O4 of the pMOS circuit block 106 and nMOS circuit blocks 108 and 109, respectively. The drain of the nMOSFET 302 is connected to the output terminal O2 of the pMOS circuit block 107 in FIG. 4.

Then, the control signal Cont is supplied to the gates of the pMOSFET 300 and nMOSFETs 302, 303. The complementary signal /Cont of the control signal Cont is supplied to the gate of the nMOSFET 301.

That is, a first switch circuit composed of the pMOSFET 300 and nMOSFET 301 is inserted between the MOS circuit blocks 106 and 108 constituting the first logic circuit 104. A second switch circuit composed of the nMOSFETs 302 and 303 is inserted between the MOS circuit blocks 107 and 109 constituting the second logic circuit 105. Then, the first and second switch circuits operate complementarily under the control of the control signals Cont and /Cont.

With this configuration, not only can the output of one logic circuit be connected to the output terminal Dout, but the output of the other logic circuit can also be electrically floated as in FIG. 5. Unlike the circuit configuration of FIG. 5, this circuit configuration is such that the second switch circuit connected to the blocks 107 and 109 in the second logic circuit 105 is composed of only nMOSFETs, enabling the driving power to be increased.

Figure 7:
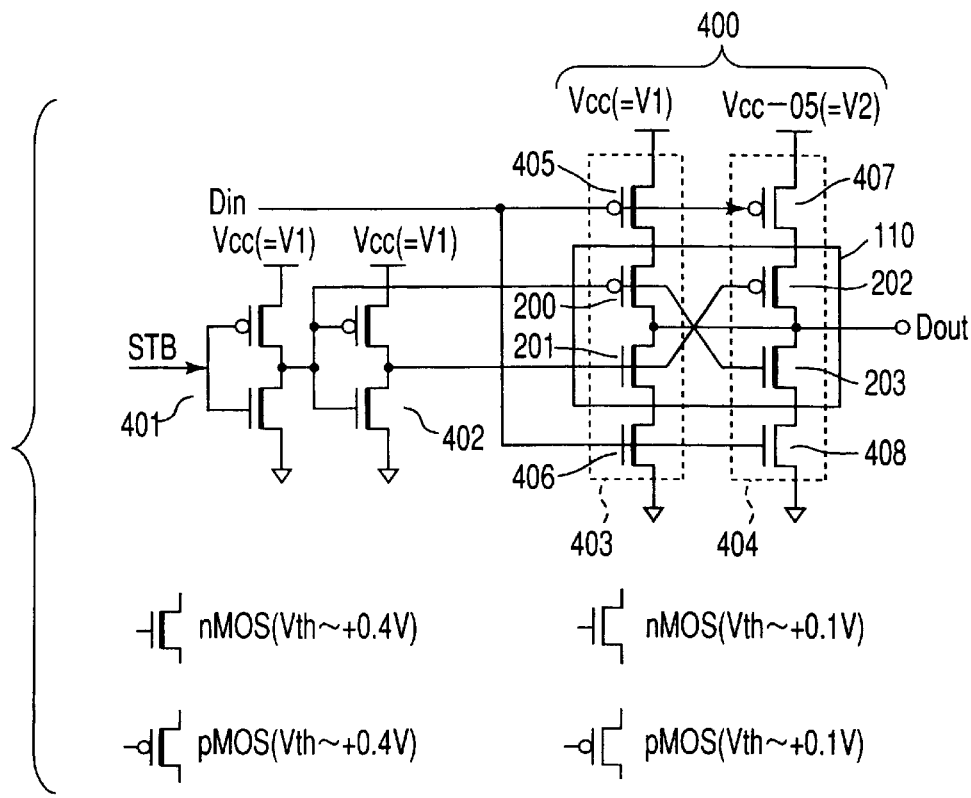
FIG. 7 is a circuit diagram showing a concrete configuration of the semiconductor integrated circuit according to the first embodiment.

FIG. 7 shows a concrete example of a semiconductor integrated circuit according to the first embodiment. Inverters 401 and 402 to which a power supply V1 is supplied are inserted to logically produce an output switching control signal and its complementary signal. The inverters 401 and 402 output a high level voltage V1 and a low level ground potential. To achieve a low leakage current characteristic, the inverters 401 and 402 are composed of FETs whose threshold voltages have high absolute values (or FETs with high threshold values).

The logic circuit is composed of a first logic circuit 403 connected to the power supply voltage V1 and a second logic circuit 404 connected to a power supply V2 (V1>V2). The output switch circuit 110 of FIG. 5 is connected to an output terminal Dout. Any of the transistors 200 to 203 constituting the output switch circuit 110 is composed of a FET with a high threshold value. In this circuit, since each of the pMOS circuit block and nMOS circuit block is composed of a single transistor, they perform logical inversion (or function as inverters).

In FIG. 7, when a standby signal STB is high, or when the semiconductor integrated circuit is in the standby state, the output of the first logic circuit 403 is connected to the output terminal Dout and the output of the second logic circuit 404 is disconnected from the output terminal Dout by the pMOSFET 202 and nMOSFET 203 which are fully off. Since the amount of leakage current is determined by the leakage characteristics of the FETs 200 and 201 with high threshold values, the amount of leakage current is much smaller than when FETs whose threshold voltages had low absolute values (or FETs with low threshold values) were used in a conventional equivalent.

On the other hand, when the standby signal STB is low, or when the semiconductor integrated circuit is in active mode, the output of the first logic circuit 403 is disconnected from the output terminal Dout by the nMOSFET 201 and pMOSFET 200 and the output of the second logic circuit 404 is connected to the output terminal Dout. At this time, since the logical amplitude of the circuit is as low as the power supply potential V2, the power consumption becomes very low.

Figure 8:
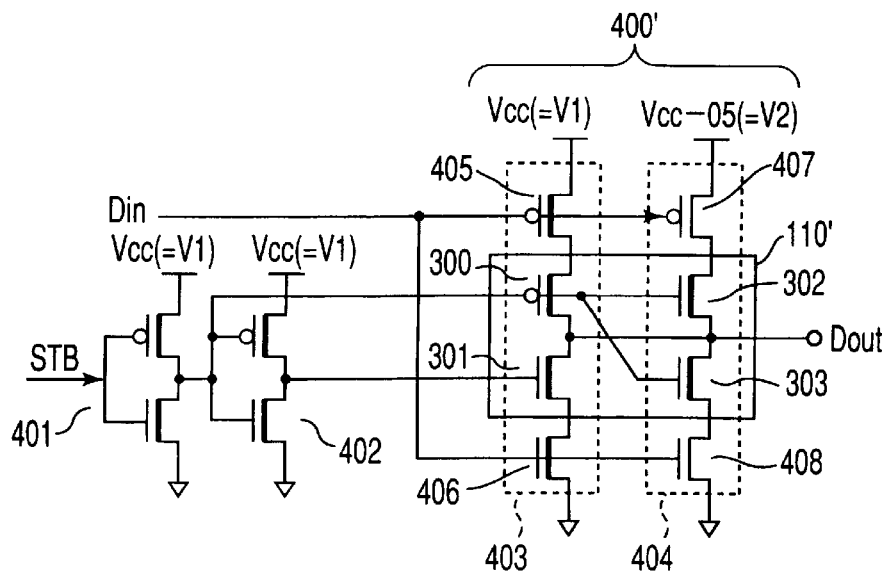
FIG. 8 is a circuit diagram showing another concrete configuration of the semiconductor integrated circuit according to the first embodiment.

FIG. 8 show another example of the semiconductor integrated circuit according to the first embodiment. Inverters 401 and 402 to which a power supply V1 is supplied are inserted to logically produce an output switching control signal and its complementary signal. The inverters 401 and 402 output a high level voltage V1 and a low level ground potential. To achieve a low leakage current characteristic, the inverters 401 and 402 are composed of FETs whose threshold voltages have high absolute values (or FETs with high threshold values). The logic circuit is composed of a first logic circuit 403 connected to the power supply voltage V1 and a second logic circuit 404 connected to a power supply V2 (V1>V2). The output switch circuit 110' of FIG. 6 is connected to the output terminal. Any of the transistors 300 to 303 constituting the output switch circuit 110' is composed of a FET with a high threshold value. In this circuit, since each of the pMOS circuit block and nMOS circuit block is composed of a single transistor, they perform logical inversion (or function as inverters).

In this circuit, when a standby signal STB is high, or when the semiconductor integrated circuit is in the standby state, the output of the first logic circuit 403 is connected to the output terminal Dout and the output of the second logic circuit 404 is disconnected from the output terminal Dout by the pMOSFETs 302 and 303 which are fully off. Since the amount of leakage current is determined by the leakage characteristics of the FETs 300 and 301 with high threshold values, the amount of leakage current is much smaller than when FETs whose threshold voltages had low absolute values (or FETs with low threshold values) were used in a conventional equivalent.

On the other hand, when the standby signal STB is low, or when the semiconductor integrated circuit is in active mode, the output of the first logic circuit 403 is disconnected from the output terminal by the nMOSFET 301 and pMOSFET 300 and the output of the second logic circuit 404 is connected to the output terminal Dout. At this time, since the logical amplitude of the circuit is as low as the power supply potential V2, the power consumption becomes very low.

Figure 9:
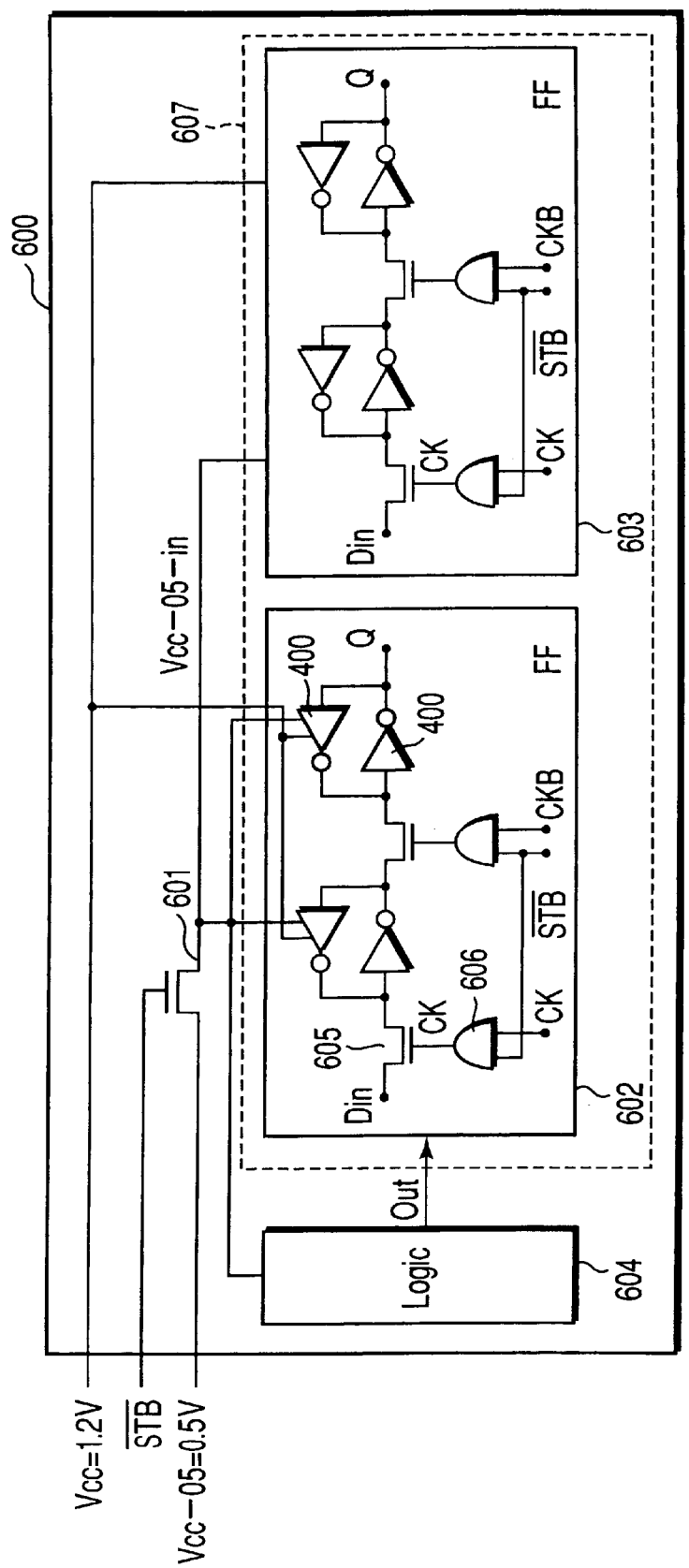
FIG. 9 is a circuit diagram showing an example using the inverter of FIGS. 7 or 8 in a flip-flop.

FIG. 9 shows an embodiment of the present invention which uses the inverter 400 of FIG. 7 in flip-flops. The inverter 400' of FIG. 8 may be used instead. To a semiconductor integrated circuit 600, Vcc and Vcc-05 are supplied as power supply. When the semiconductor integrated circuit is in active mode, Vcc and Vcc-05 are supplied to the internal circuit. When the integrated circuit is in the standby state, Vcc is supplied to the internal circuit.

The semiconductor integrated circuit 600 comprises master-slave flip-flops 602 and 603 and an ordinary logic circuit 604. Each of the mater-slave flip-flops 602 and 603 is composed of the inverters 400 (or 400') of FIG. 7 (or FIG. 8) and a transfer gate 605 made up of pMOSFET and nMOSFET connected in parallel. Vcc-05 can be connected to or disconnected from an internal power supply line Vcc-05-in by an nMOSFET 601 to whose gate a standby signal /STB is inputted.

The high potential power supply Vcc is supplied to the master-slave flip-flop 602 and 603. The internal power supply line Vcc-05-in is supplied to internal logic circuits 602 to 604 each including flip-flops. When the integrated circuit is in operation, a clock is inputted to the inputs of the transfer gates in the master-slave flip-flops 602 and 603. When the integrated circuit is in the standby state, the clock signal is inputted via an AND gate 606 so that the integrated circuit may be off.

Since the wiring of the power supply Vcc and Vcc-05-in within the flip-flops 602 and 603 seems complicated in the figure, only the connection of them to the inverter 400 at the top of the flip-flop 602 is shown and the rest is omitted.

With this configuration, since the nMOSFET 601 is on in the operating state, Vcc-05 and Vcc-05-in become equal to each other. Then, since the inverters in the master-slave flop-flops 602 and 603 operate with a logical amplitude of Vcc-05 and the logic circuits in the semiconductor integrated circuit 600 including the logic circuit 604 operate with an amplitude of Vcc-05, enabling a low power consumption operation.

Figure 10:
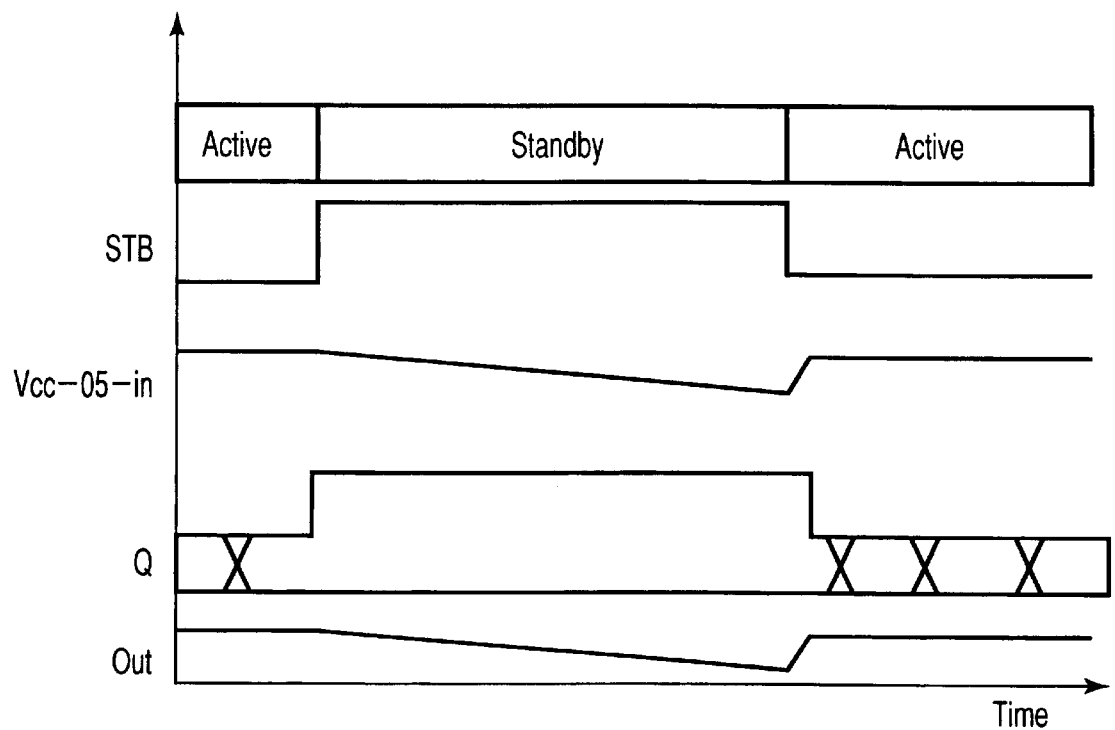
FIG. 10 is a timing diagram showing a change in the voltage at each node of the logic circuit of FIG. 9.

On the other hand, when the semiconductor integrated circuit is in the standby state, or when the nMOSFET 601 is off, Vcc-05 is disconnected from Vcc-05-in, with the result that Vcc-05-in approaches the ground potential gradually (see Vcc-05-in of FIG. 10). Thus, the high level of the logic circuits, such as the logic circuit 604, in the semiconductor integrated circuit 600 approaches the ground potential gradually (see Out in FIG. 10).

Furthermore, Since the inverters in the master-slave flip-flops 602 and 603 are connected to the high power supply potential Vcc, the transfer gate 605 is gated with a clock signal so as to be off in the standby state, putting the high level at Vcc and the low level at the ground potential, which causes the contents of the flip-flop to be held (see Q of FIG. 10). When the semiconductor integrated circuit changes from the standby state to the operating state, the high level becomes Vcc-05 and the low level becomes the ground potential in the flip-flop, taking a recovering time of several nanoseconds into account, which enables the integrated circuit to operate again (see Q in FIG. 10).

FIG. 10 shows the potential at each node in the above explanation. FIG. 10 particularly shows how the internal power supply Vcc-05-in, the outputs of the master-slave flip-flops 602 and 603, and the output of the logic circuit change in the operating state and in the standby state. Here, the FET 601 is assumed to be an nMOS. The same effect can be produced even if the FET 601 is a pMOS controlled by the standby signal STB.

Figure 11:
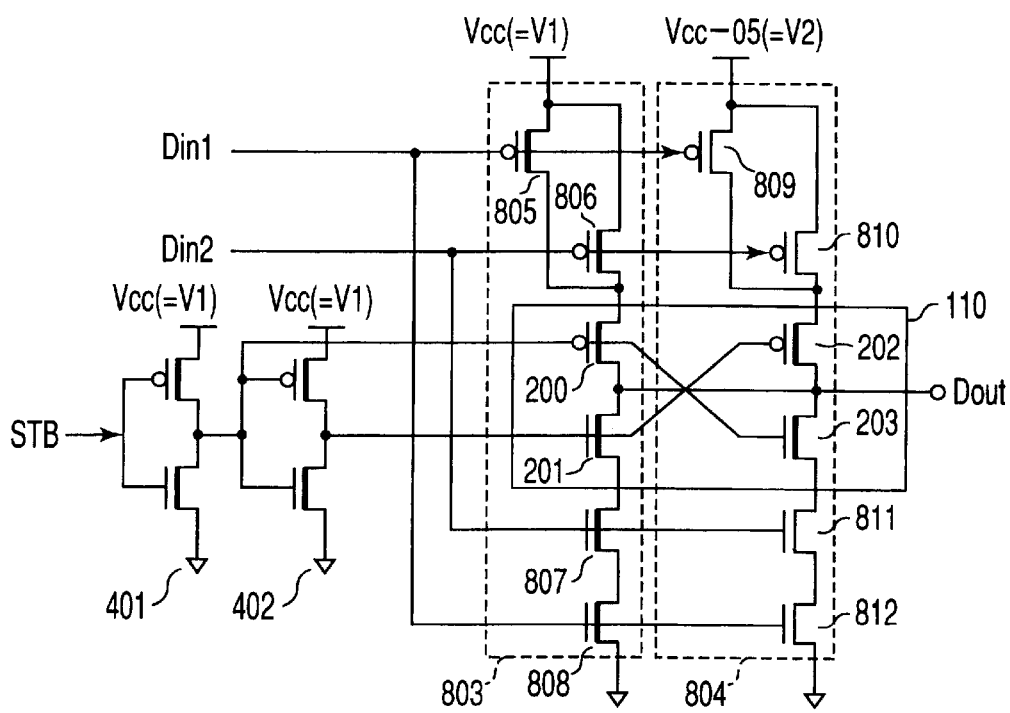
FIG. 11 is a circuit diagram showing still another concrete configuration of the semiconductor integrated circuit according to the first embodiment.

The first embodiment related to FIG. 4 will be shown concretely by reference to FIG. 11. Although an example will be given on the assumption that 0.25-$\mu$m CMOS processing is effected, any level of microfabrication may be basically acceptable, provided that CMOS processing is effected. While FIG. 7 shows an example of using inverters, FIG. 11 shows an example of using 2-input NAND gates.

Let the power supply voltage Vcc be 1.2 V, the electromotive force of an ordinary primary battery or a secondary battery of the Ni family. Let Vcc-05 be 0.5 V on the assumption that it is produced from the DC-DC conversion of Vcc. In FIG. 11, FETs whose conducting paths are represented by thick lines have high threshold values. In this case, the threshold voltage of an nMOSFET is 0.4 V and that of a pMOSFET is −0.4 V. The other FETs in FIG. 11 have low threshold values. In this case, the threshold voltage of an nMOSFET is 0.1 V and that of a pMOSFET is −0.1 V.

Inverters 401 and 402 are composed of FETs with high threshold values, to which Vcc is supplied. The gate is used to produce a control signal to bring the internal logic circuit into the standby state or the operating state. It is necessary to determine the size of FETs according to its load. Since only one gate of the logic circuit is to be driven, the pMOSFET has a gate width of 8 $\mu$m and the nMOSFET has a gate width of 4 $\mu$m. The reason why the gate width of the pMOSFET is made different from that of the nMOSFET is that the driving capability of the former is made equal to that of the latter.

The logic circuit is made of a first logic circuit 803 and a second logic circuit 804, each of which constitutes a 2-input NAND gate. The first logic circuit 804 is composed of pMOSFETs 805 and 806 and nMOSFETs 807 and 808. The second logic circuit 803 is composed of pMOSFETs 809 and 810 and nMOSFETs 811 and 812.

MOSFETs 200 to 203 constitute the output switch circuit 110 explained in FIG. 5. All of the MOSFETs 200 to 203 have high threshold values.

Each of the FETs 805 to 808 and FETs 200 and 202 has a gate width of 1 $\mu$m. The FETs 809, 810 and 202 each have a gate width of 2 $\mu$m. The FETs 203, 811 and 812 each have a gate width of 1 $\mu$m. When Din1=Din2=Vcc and Dout=0 in the standby state of this configuration, the FETs 805, 806, 809, 810, 202 and 203 are off and the other FETs are on.

If the S factor determining the sub-threshold characteristic is 100 mV/decade, the leakage currents (10 nA) in the FETs

809 and 810 are about 1000 times larger than those in the other FETs. That is, if the resistances are ignored because they are low, the leakage current paths take the following routes:

Vcc-05→202→GND and Vcc→805 and 806→GND (Note the MOSFET 200 is on). Since the leakage currents are determined by the FET 202 and the FETs 805 and 806, the worst leakage current is about 30 pA.

In another worst case, when Din1=Vcc, Din=GND, and Dout=Vcc output, the FETs 805, 807, 809, 811, 202 and 203 are off. Since the leakage currents (10 nA) in the FETs 809 and 811 are about 1000 times larger than those in the other FETs, the resistances thereof are ignored. Then, the leakage current paths take the following routes:

Vcc-05→202→203 or 807→GND and Vcc→805→203 or 807→GND (Note the MOSFET 200 is on). Thus, the worst leakage current is about 20 pA.

On the other hand, although the FETs 200 and 201 are off in the operating state, since the leakage current passing through the FETs 200 and 201 is as small as about 10 pA, the power consumption in the operating state is determined by the charging and discharging action in the capacitances at the FETs 809 to 812, 201 and 202. At this time, since the logic amplitude of Dout is 0.5 V, the drawn current is very small in the operating state.

Figure 1:
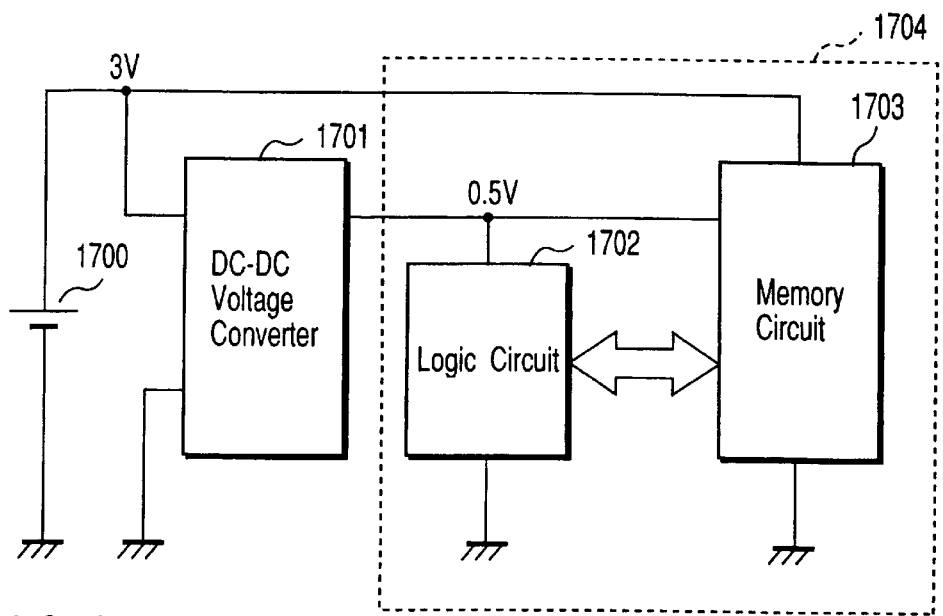
FIG. 1 is a block diagram showing a configuration of a conventional low-power-consumption semiconductor integrated circuit.
Figure 2:
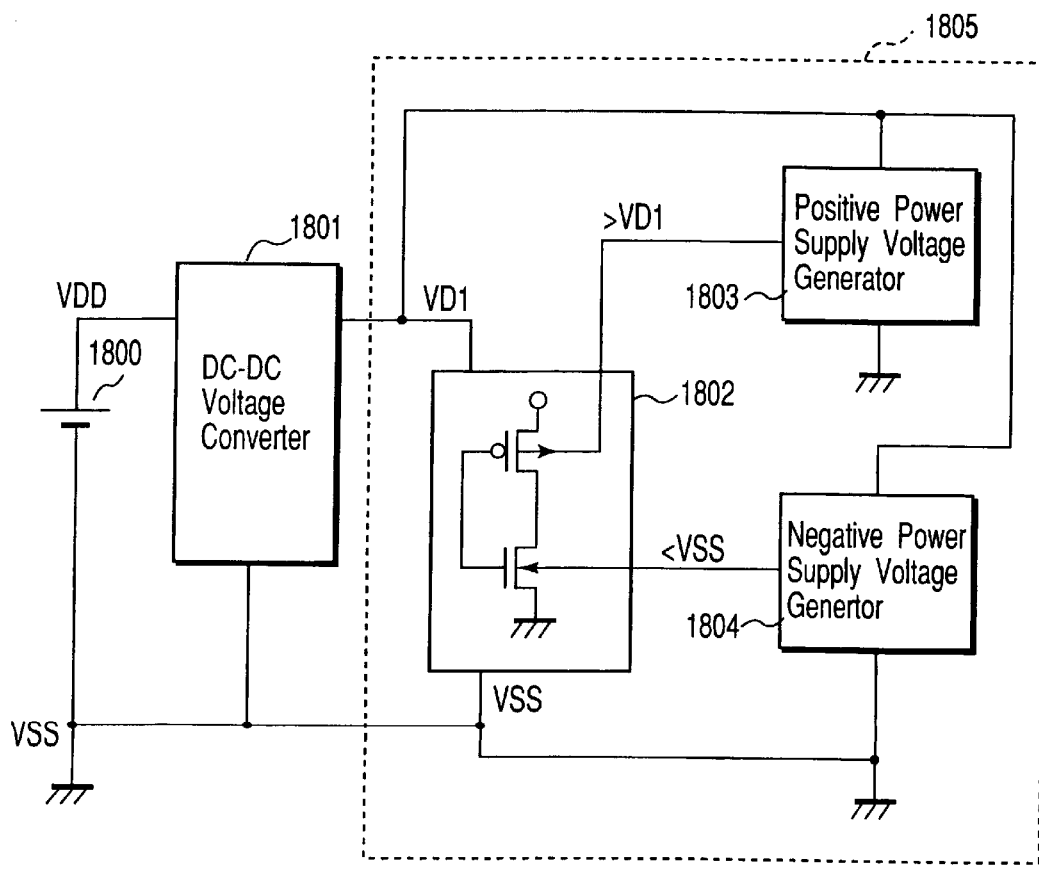
FIG. 2 is a block diagram showing another configuration of a conventional low-power-consumption semiconductor integrated circuit.

The first embodiment is compared with the conventional equivalents. In the method of changing the potential of the substrate shown in FIG. 2, consider a case where a threshold voltage of ±0.4 V is realized in the standby state with a CMOS circuit where the threshold voltages of the pMOSFET and nMOSFET are ±0.1 V in the operating state as in the first embodiment. To do this, it is necessary to apply a potential of −0.5 V to −3 V to the nMOSFET and a potential of −0.5 V to −1.5 V to the pMOSFET as the potential applied to the substrate. Because the potential of the substrate with a large capacity must be changed 1 V or more, the size of the substrate potential generator becomes very large, taking the driving capability into account.

Figure 3:
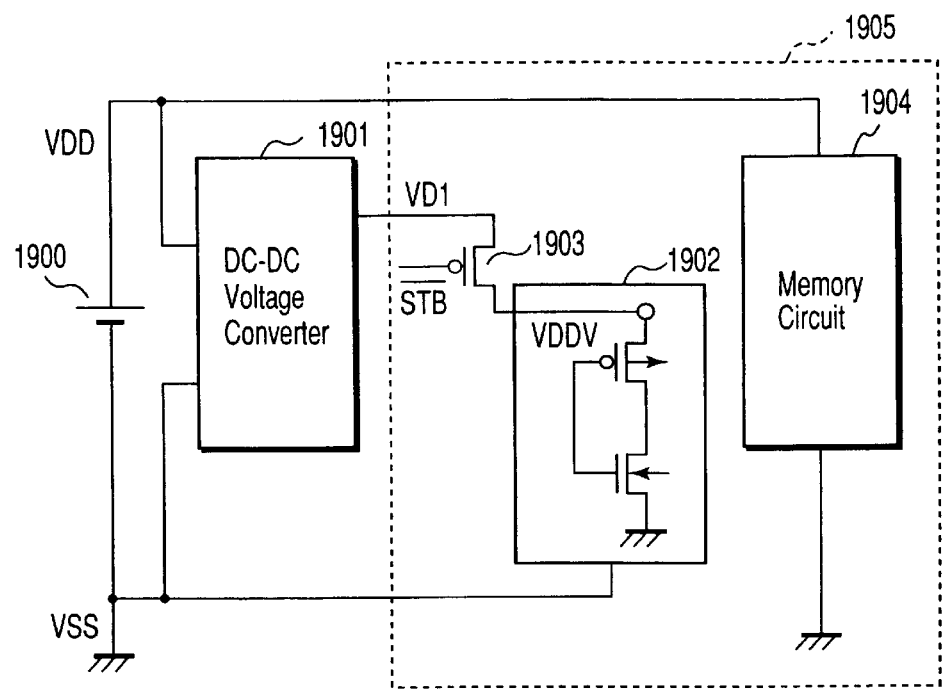
FIG. 3 is a block diagram showing still another configuration of a conventional low-power-consumption semiconductor integrated circuit.

On the other hand, in the method using the switch transistors shown in FIG. 3, because the power supply is disconnected in the standby state, it is difficult to operate the logic circuits or hold the data. In the first embodiment, such a problem is avoided, which differs from the method of FIG. 3. Although the output switch circuit 110 of FIG. 5 has been used, the same effect can be produced even when the switch circuit 110' of FIG. 6 is used.

Figure 20:
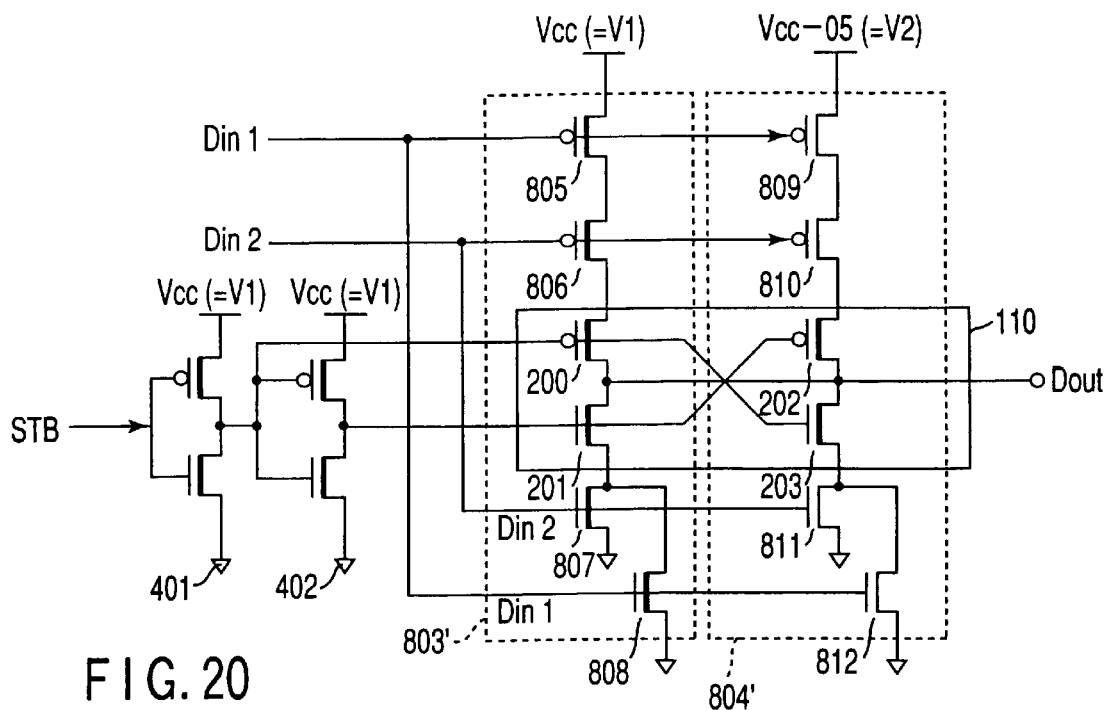
FIG. 20 is a circuit diagram showing still another concrete configuration of the semiconductor integrated circuit according to the first embodiment.

In FIG. 11, an circuit configuration using NAND gates is shown as the first and second logic circuits. However, the first embodiment can be applied to a circuit configuration using NOR gates as shown in FIG. 20 or combined gate configuration as shown in FIG. 21.

Figure 21:
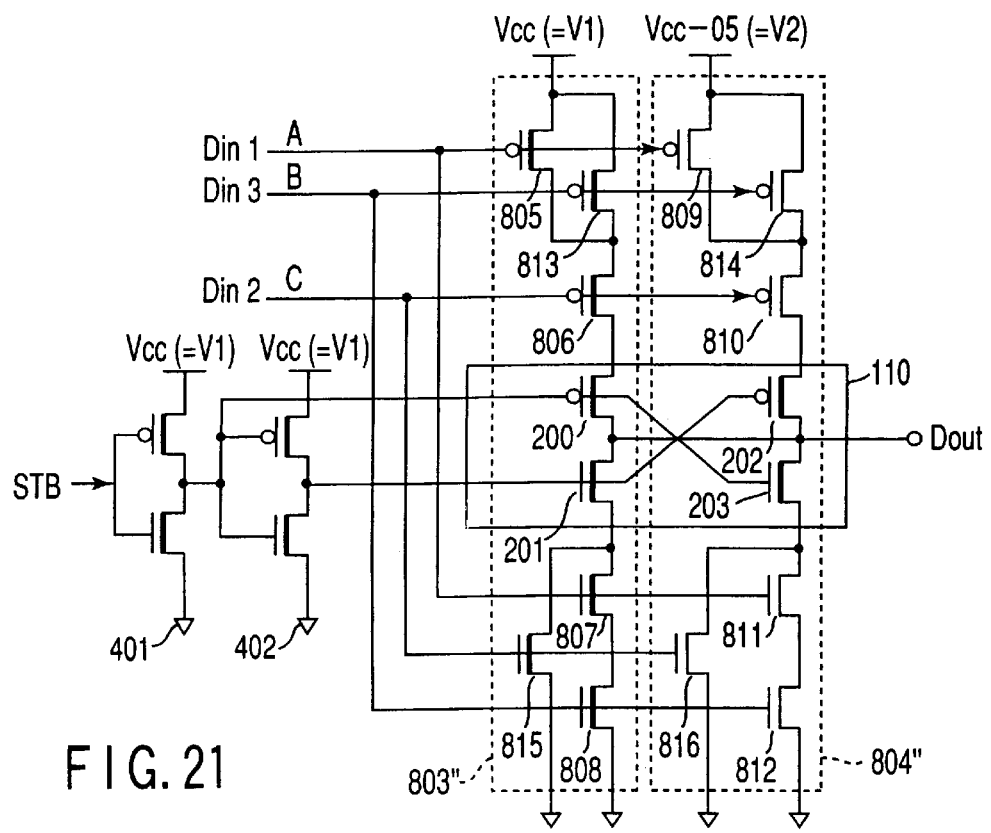
FIG. 21 is a circuit diagram showing still another concrete configuration of the semiconductor integrated circuit according to the first embodiment.

The combined gate configuration of FIG. 21 is a logic circuit having a logic expressed as an inversion of (A·B+C), when the three inputs are A, B and C.

Second Embodiment

FIG. 12 shows the master-slave flip-flop section 607 of FIG. 9 in detail, which does not include the power switch 601.

As for power supply voltages, it is assumed that Vcc is 1.2 V and Vcc-0.5 is 0.5 V. The flop-flop is composed of an inverter 901 acting as a standby signal buffer, inverters 902 and 903 acting as clock buffers, transfer gates 904 and 905, a master latch 906, a slave latch 907, and transfer gate driving buffers 908 to 911.

The transfer gates 904 and 905 correspond to the transfer gate 605 of FIG. 9. The transfer gate driving buffers 908 to 911 correspond to the gate 606 of FIG. 9.

Figure 14:
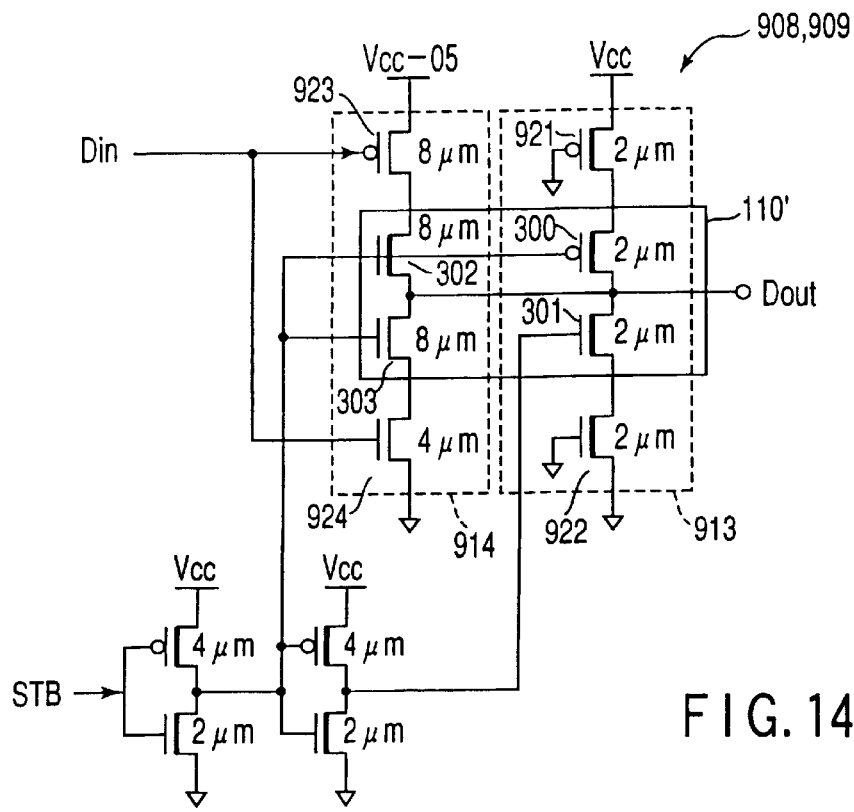
FIG. 14 is a circuit diagram showing a configuration of the buffer circuit (Buf1) 908 or 909 used in FIG. 12.
Figure 15:
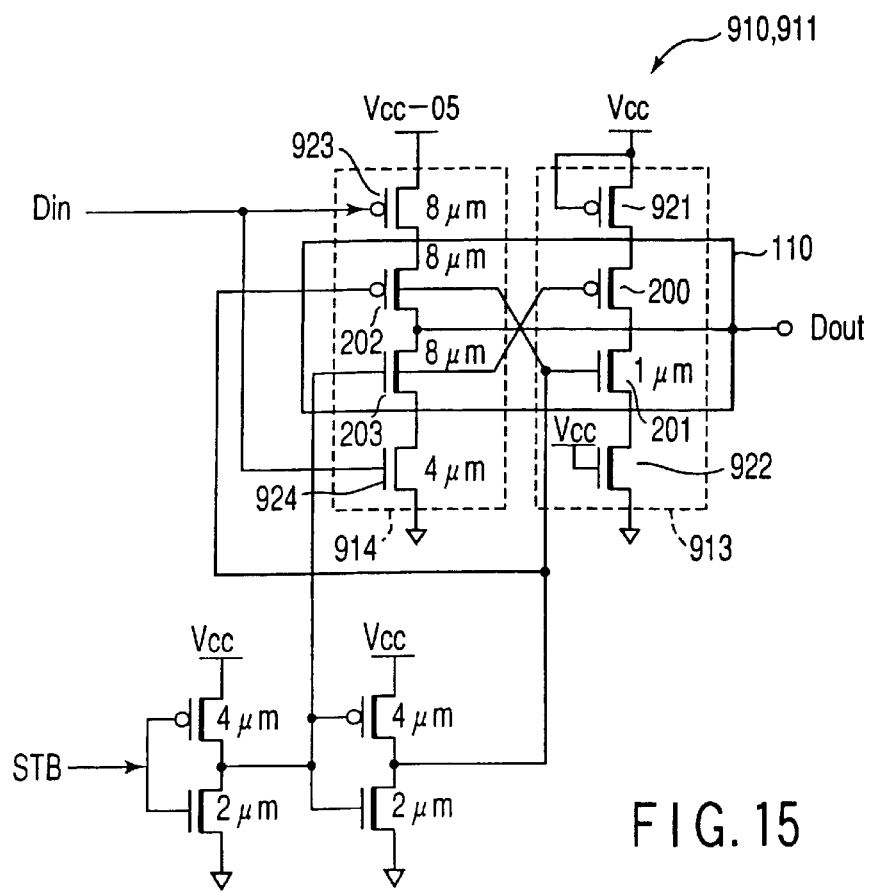
FIG. 15 is a circuit diagram showing a configuration of the buffer circuit (Buf0) 910 or 911 used in FIG. 12.

FIG. 13 shows a configuration of the latch circuit 906 or 907. FIG. 14 shows a configuration of the buffer circuit (Buf1) 908 or 909 which drives the gate of the pMOSFET in the transfer gate 904 or 905. FIG. 15 shows a configuration of the buffer circuit (Buf0) 910 or 911 which drives the gate of the nMOSFET in the transfer gate 904 or 905. The corresponding gate width is added to each MOSFET in FIGS. 13 to 15.

In the circuit configuration of the latch 906 or 907 in FIG. 13, the inverters 400 of the first embodiment are connected each other to form a latch circuit. The circuit configuration of the buffer 908 or 909 (Buf1) in FIG. 14 and that of the buffer 910 or 911 (Buf0) in FIG. 15 are similar to the configuration of the first embodiment, but differ from the first embodiment in that the first logic circuit differs from the second logic circuit in logic functions. That is, the output switch circuit 110' or 110 switches between the second logic circuit 914 composed of an inverter and the first logic circuit 913 different from an inverter. Either the output switch circuit 110 or 110' may be used.

In the master-slave flip-flop 607 of FIG. 12, the data is stored in the latches 906 and 907 through the transfer gates 904 and 905, respectively, in the operating state. At this time, since the logic amplitude of the output node (Dout) of the flip-flop is 0.5 V determined by Vcc-05, the flip-flop can operate with a low power consumption. With the standby signal STB=1, when the flip-flop goes into the standby state, the output of Buf1 of the buffer driving the transfer gates 904 and 905 becomes constant at Vcc and the output of Buf0 becomes constant at 0, making the transfer gates 904 and 905 open (or off).

On the other hand, since the gates in the latches 906 and 907 are composed of the inverters 400 (or 400') of the first embodiment, their contents are held with a potential of Vcc or 0. Because the Vcc-05 power supply line of the buffers 908 and 909 driving the transfer gates 904 and 905 is disconnected from the output node Dout in the latch via the off transistor, even if Vcc-05 is brought into the floating state by, for example, the FET 601 as shown in FIG. 9, the data is held without any problem.

Since the master-slave flip-flop operates using the inverters explained in the first embodiment or a buffer circuit with a similar configuration, the leakage current in the standby state can be reduced to 100 pA or less. When the flip-flop is in active mode, it can realize a logic amplitude of 0.5 V and a low power consumption operation.

As described above, the master-slave flip-flop operates with a low leakage current and a low power consumption. Since the master-slave flip-flop can maintain the low leakage current characteristic in the standby state, regardless of the node potential of Vcc-05, this enables Vcc-05 to be made a floating node.

Therefore, by stopping the power supply to the logic circuits excluding the flip-flop and enabling the flop-flop to store the data, the leakage current in the semiconductor integrated circuit can be reduced to only the holding current of the flip-flop as a whole. This enables the power consumption to be reduced remarkably.

A 100-bit shift register composed of the mater-slave flip-flops was formed experimentally in 0.25-$\mu$m CMOS process. Then, the operation of the shift register was confirmed at 100 MHz.

While in FIG. 14, since the FET 921 is always on, the FET 921 can be omitted with the source of the FET 300 connected to the Vcc, and since the FET 922 is always off, the FETs 301 and 922 can be omitted.

In FIG. 15, since the FET 921 is always off, the FETs 300 and 921 can be omitted, and since the FET 922 is always on, the FET 922 can be omitted with the source of the FET 301 connected to the ground.

Third Embodiment

Figure 16:
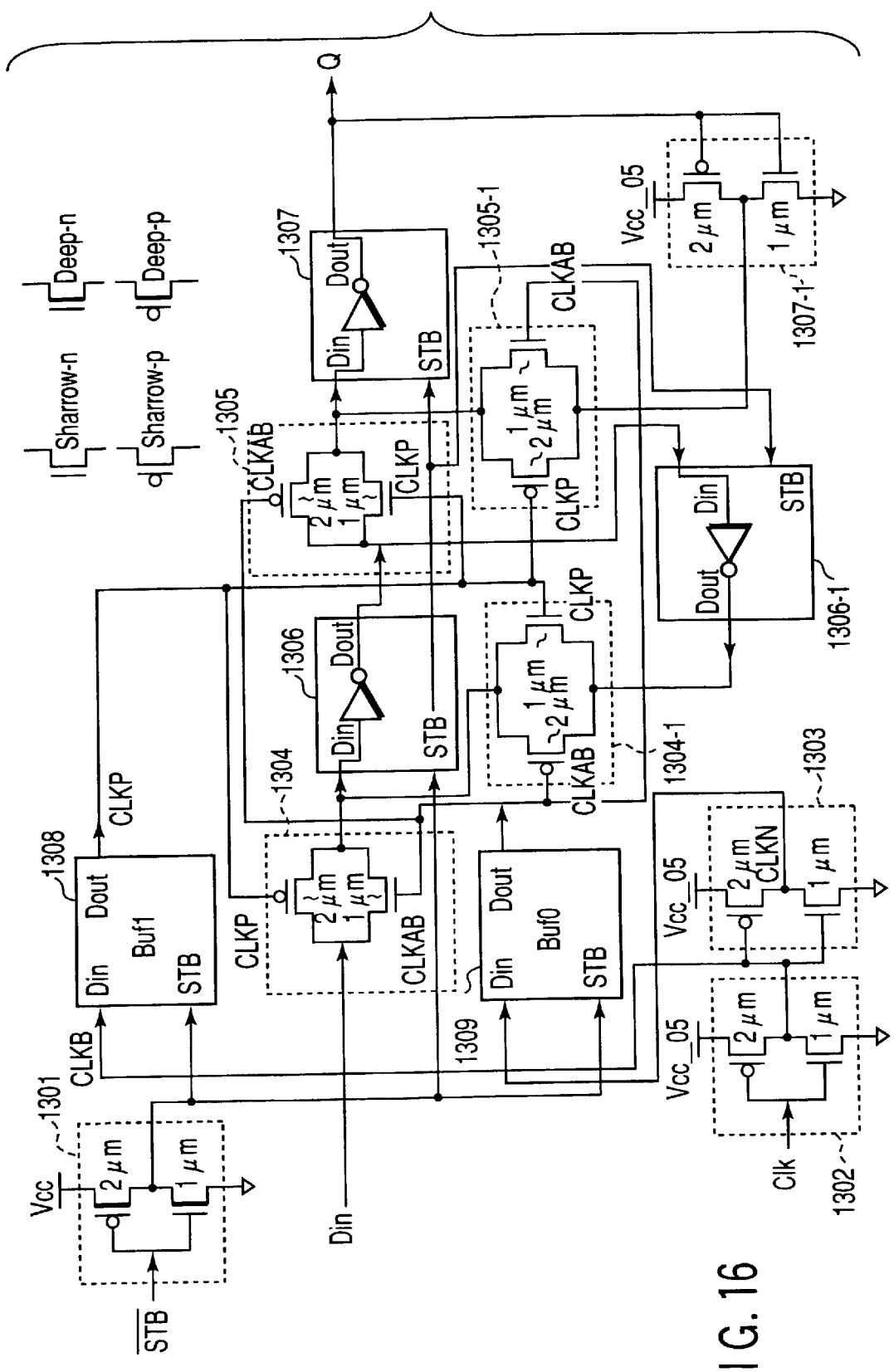
FIG. 16 is a block diagram of a master-slave flip-flop according to a third embodiment of the present invention.

FIG. 16 shows another concrete example related to the master-slave flip-flop of FIG. 9.

As for power supply voltages, it is assumed that Vcc is 1.2 V and Vcc-0.5 is 0.5 V. The flop-flop is composed of an inverter 1301 acting as a standby signal buffer, inverters 1302 and 1303 acting as clock buffers, transfer gates 1304, 1305, 1304-1 and 1305-1 made up of pMOSFETs and nMOSFETs, master latch flip-flops 1306 and 1306-1, slave latch flip-flops 1307 and 1307-1, and transfer gate driving buffers 1308 and 1309. The corresponding gate width is added to each FET in FIGS. 16 to 19.

Figure 17:
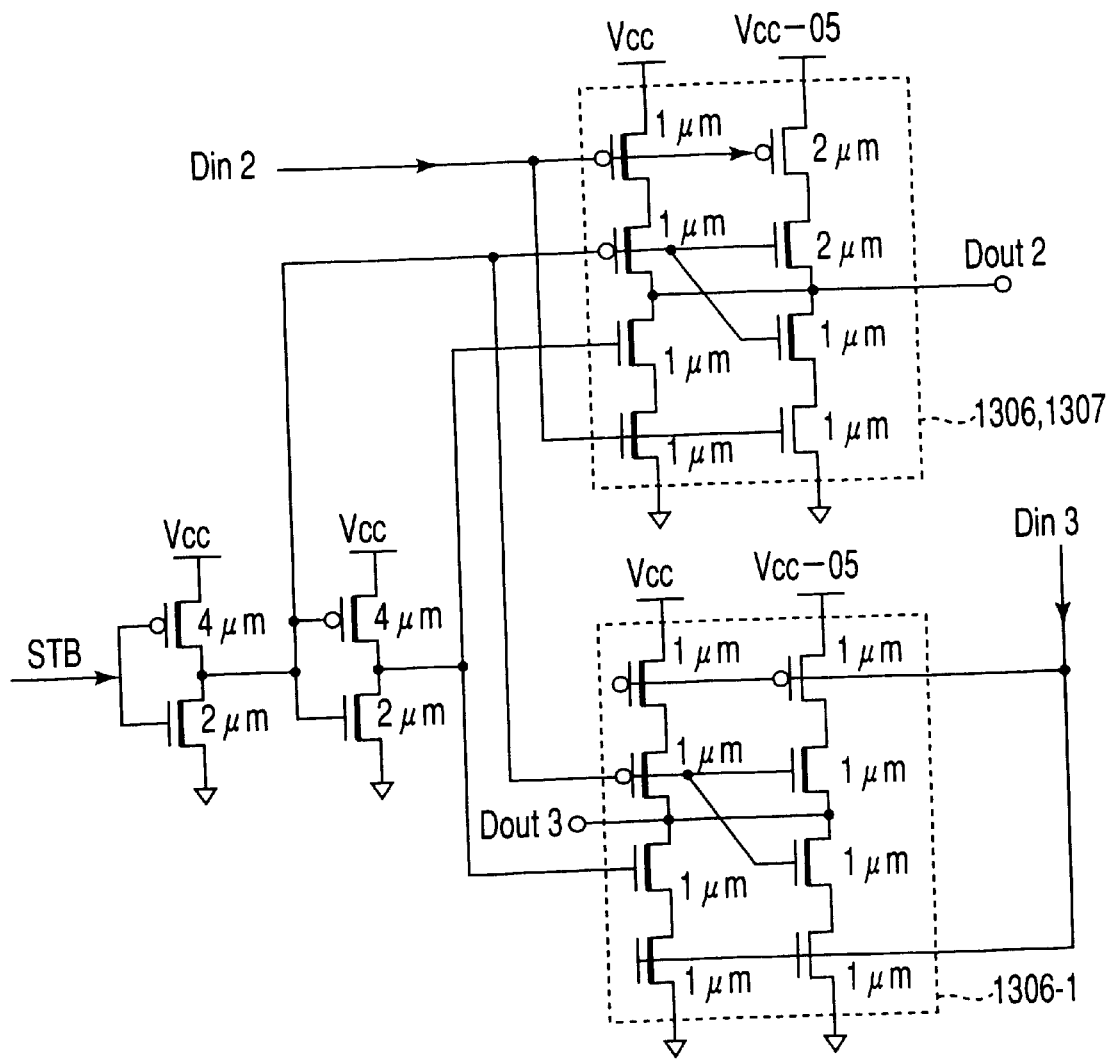
FIG. 17 is a circuit diagram showing a configuration of the master latch circuits 1306, 1307, and 1306-1 used in FIG. 16.

FIG. 17 shows the circuit configuration of the inverter used in each of the master latch flip-flops 1306 and 1306-1 and slave latch flip-flop 1307. The circuit configuration of inverter of FIG. 17 is basically the same as that of the FIG. 6 in the first embodiment. The inverter of FIG. 17 may take the circuit configuration of FIG. 5.

Figure 18:
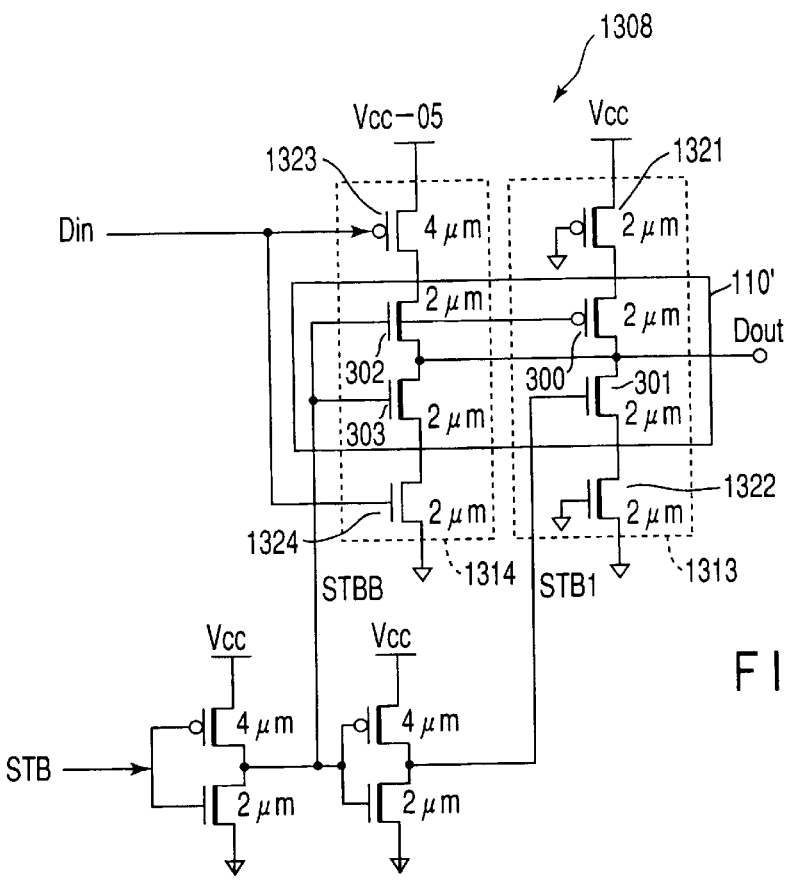
FIG. 18 is a circuit diagram showing a configuration of the buffer circuit (Buf1) 1308 used in FIG. 16.

FIG. 18 shows the circuit configuration of the transfer gate driving buffer 1308 (Buf1) which drives the gates of the pMOSFETs in the transfer gates 1304 and 1305-1, and the gates of the nMOSFETs in the transfer gates 1305 and 1304-1. When the standby signal STB is high (or in the standby state), a constant voltage of Vcc is outputted to Dout.

Figure 19:
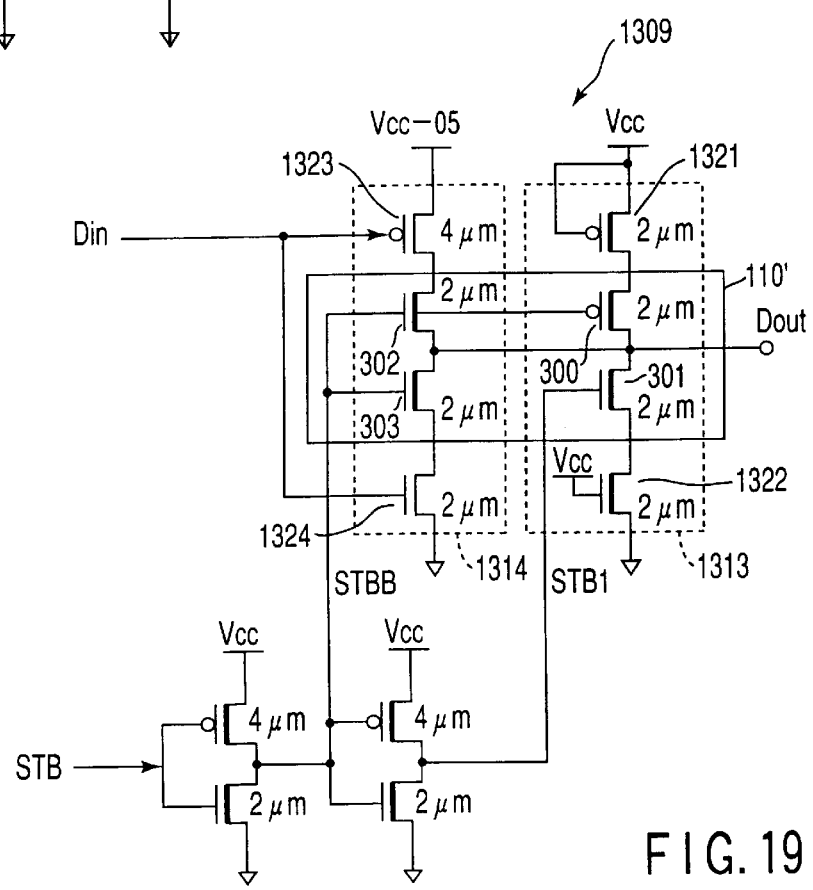
FIG. 19 is a circuit diagram showing a configuration of the buffer circuit (Buf0) 1309 used in FIG. 12.

FIG. 19 shows the circuit configuration of the transfer gate driving buffer 1309 (Buf0) which drives the gates of the nMOSFETs in the transfer gates 1304 and 1305-1, and the gates of the pMOSFETs in the transfer gates 1305 and 1304-1. The circuit configuration of the buffer 1309 is basically the same as that of FIG. 15 in the second embodiment. When the standby signal STB is high (or in the standby state), a constant voltage of 0 V is outputted to Dout.

While in FIG. 18, since the FET 1321 is always on, the FET 1321 can be omitted with the source of the FET 300 connected to the Vcc, and since the FET 1322 is always off, the FETs 301 and 1322 can be omitted.

In FIG. 19, since the FET 1321 is always off, the FETs 300 and 1321 can be omitted, and since the FET 1322 is always on, the FET 1322 can be omitted with the source of the FET 301 connected to the ground.

When the master-slave flip-flop of FIG. 16 is in active mode, the data is stored in the master latch flip-flop 1306 and slave latch flip-flop 1307 through the transfer gates 1304 and 1305, respectively. At this time, since the logic amplitude of the output node Dout of the flip-flop is 0.5 V determined by Vcc-05, the flip-flop can operate with a low power consumption.

With the standby signal STB=b 1, when the flip-flop goes into the standby state, the output of Buf1 which drives the transfer gates becomes Vcc and the output of Buf0 becomes 0, turning off the transfer gates 1304 and 1305-1. At this time, since the transfer gate 1304-1 is on, the contents of the master latch are held at a potential of Vcc or 0.

On the other hand, since the transfer gate 1305 is conducting, the slave side outputs the potential of Vcc-05, which is a floating node, or the ground potential of 0 V via the flip-flop 1307. This master-slave flip-flop enables the leakage current in the standby state to be reduced to 100 pA or less as in the second embodiment. When the flip-flop is in active mode, it can realize a logic amplitude of 0.5 V and therefore a low power consumption operation.

As described above, the master-slave flip-flop operates with a low leakage current and a low power consumption. Since the master-slave flip-flop can maintain the low leakage current characteristic in the standby state, regardless of the potential of Vcc-05, this enables Vcc-05 to be made a floating node.

Therefore, by stopping the power supply to the logic circuits excluding the flip-flop and enabling the flop-flop to store the data, the leakage current in the semiconductor integrated circuit can be reduced to only the holding current of the flip-flop as a whole. This enables the power consumption to be reduced remarkably.

A 100-bit shift register composed of the mater-slave flip-flops was formed experimentally in 0.25-$\mu$m CMOS process. Then, the operation of the shift register was confirmed at 100 MHz.

This invention is not limited to the above embodiments. In addition to 2-input NAND gates, inverters, and flip-flops, NOR, OR/NAND, AND/NOR, and latch circuits may be used as the logic circuits. Use of these types of circuits would produce the same effect.

In the second and third embodiments, FET switches have been used to bring the internal power supply into the floating state. The present invention is not restricted to this method. For instance, a DC-DC converter may be connected and a logic circuit be added to the gate of the buffer circuit in the final stage of the DC-DC converter, thereby making the output node a floating node.

While 1.2 V has been used as the voltage of the Vcc power supply, a configuration using a higher voltage of the power supply may be employed, provided that the breakdown voltage is sufficiently high or a sufficient breakdown voltage is secured with a vertically stacked structure of FETs.

In the embodiments, all of the FETs have been of the MOS type. The FETs of the MOS type here are not limited to FETs using oxide films as gate insulating films and include FETs of the so-called MIS type which use insulating films other than oxide films.

As has been described above in detail, with the present invention, a semiconductor integrated circuit with logic circuits whose logic amplitude is as low as about 0.5 V comprises a first logic circuit and a second logic circuit. The first and second logic circuits have common input terminals and the same logic function. The first logic circuit is composed of a circuit block made up of a pMOSFET and a circuit block made up of an nMOSFET, each circuit having a high threshold value. The second logic circuit is composed of a circuit block made up of a pMOSFET and a circuit block made up of an nMOSFET, each circuits having a low threshold value.

An output switch circuit intervenes between the pMOS circuit block and nMOS circuit block in each logic circuit. The output switch circuit controls the connection and disconnection of each logic circuit to and from the power supply. When the integrated circuit is in active mode, the second logic circuit using the MOSFET with a low threshold voltage for logical switching is connected to the output, thereby operating the integrated circuit with a low power consumption. When the integrated circuit is in the standby state, the first logic circuit with the MOSFET with a high threshold voltage inserted in the leakage current route is connected to the output, thereby enabling the integrated circuit to operate according to the low leakage current characteristic.

This makes it possible to realize a lower power consumption in the operating and standby states without using a complicated control circuit in the logic circuits operating on the very low power supply voltage of about 0.5 V. Furthermore, the decrease of the layout area and the facilitation of the design make it possible to reduce the manufacturing cost of semiconductor integrated circuits.

In addition, when the memory circuits, including flip-flops, are constructed using the above logic circuits and the logic circuits excluding the memory circuits are allowed to be disconnected from the power supply, the logic circuits, in the operating state, operate from the low potential power supply according to the low power consumption characteristic and, in the standby state, holds the data in the flip-flops and disconnects the other logic circuits from the power supply, thereby remaining in the standby state according to the small leakage current characteristic.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit comprising:

a first logic circuit which has a first input terminal and comprising a first logic block including a p-type FET with a threshold voltage of Vtp1 and a first inverted-logic block including an n-type FET with a threshold voltage of Vtn1, said first logic block and said first inverted-logic block being connected between a first power supply with a potential V1 and a reference potential;

a second logic circuit which has the same logic function as that of said first logic circuit, said second logic circuit having a second input terminal connected to said first input terminal and comprising a second logic block including a p-type FET with a threshold voltage of Vtp2 (Vtp2<Vtp1) and a second inverted-logic block including an n-type FET with a threshold voltage of Vtn2 (Vtn2<Vtn1), said second logic block and said second inverted-logic block being connected between a second power supply with a potential of V2 (V2<V1) and said reference potential; and an output switch circuit which intervenes between said first logic block and said first inverted-logic block in said first logic circuit and between said second logic block and said second inverted-logic block in said second logic circuit and which has a control signal terminal to which a control signal is inputted and an output terminal from which one of an output of said first logic circuit and an output of said second logic circuit is outputted according to said control signal.

2. The semiconductor integrated circuit according to claim 1, wherein said output switch circuit sets one of said first logic circuit and said second logic circuit to a low impedance and the other to a high impedance and outputs said output of said one of said first logic circuit and said second logic circuit set to said low impedance to said output terminal.

3. The semiconductor integrated circuit according to claim 1, wherein said output switch circuit includes a first switch circuit comprising a first p-type FET and a first n-type FET connected in series between said first logic block and said first inverted-logic block in said first logic circuit, and a second switch circuit comprising a second p-type FET and a second n-type FET connected in series between said second logic block and said second inverted-logic block in said second logic circuit, a connection node of said first p-type FET and said first n-type FET and a connection node of said second p-type FET and said second n-type FET being connected to said output terminal, and when said first p-type FET and said first n-type FET are on according to said control signal, said second p-type FET and said second n-type FET are off, and when said first p-type FET and said first n-type FET are off, said second p-type FET and said second n-type FET are on.

4. The semiconductor integrated circuit according to claim 3, wherein said control signal to switch said output is inputted to gates of said first p-type FET of said first switch circuit and said second n-type FET of said second switch circuit and an inverted signal of said control signal is inputted to gates of said first n-type FET of said first switch circuit and said second p-type FET of said second switch circuit.

5. The semiconductor integrated circuit according to claim 1, wherein said output switch circuit comprises a first switch circuit where a first p-type FET and a first n-type FET are connected in series between said first logic block and said first inverted-logic block in said first logic circuit, a connection node of said first p-type FET and said first n-type FET being connected to said output terminal, and a second switch circuit where a second and a third n-type FET are connected in series between said second logic block and said second inverted-logic block in said second logic circuit, a connection node of said second and said third n-type FET being connected to said output terminal, and when each of said FETs in one of said first switch circuit and said second switch circuit is on according to said control signal, each of said FETs in the other switch circuit is off.

6. The semiconductor integrated circuit according to claim 5, wherein said control signal is inputted to gates of said first p-type FET of said first switch circuit and said second and said third n-type FET of said second switch circuit and an inverted signal of said control signal is inputted to a gate of said first n-type FET of said first switch circuit.

7. The semiconductor integrated circuit according to claim 1, wherein each of said first and said second logic circuit functions as an inverter.

8. A semiconductor integrated circuit which uses the semiconductor integrated circuit of claim 7 as an inverter section of a flip-flop.

9. The semiconductor integrated circuit according to claim 8, wherein said second power supply is connected via a switching transistor to said second logic circuit and, when said output switch circuit selects said output of said first logic circuit, said second logic circuit is disconnected from said second power supply.

10. The semiconductor integrated circuit according to claim 1, wherein each of said first and said second logic circuit is one selected from the group consisting of a NAND gate, a NOR gate and a combined gate configuration.

11. A semiconductor integrated circuit comprising:
a first switching gate to which an input signal is supplied;
a master flip-flop which includes a semiconductor integrated circuit of claim 1 and to which an input signal is inputted via said first switching gate;
a second switching gate to which an output signal of said master flip-flop is supplied;
a slave flip-flop which includes a semiconductor integrated circuit of claim 1 and to which said output signal of said master flip-flop is inputted via said second switching gate; and
a buffer circuit which includes a semiconductor integrated circuit of claim 1 and controls said first and said second switching gate.

12. A semiconductor integrated circuit comprising:
a first logic circuit which has a first input terminal and comprising a first logic block including a p-type FET with a threshold voltage of Vtp1 and a first inverted-logic block including an n-type FET with a threshold voltage of Vtn1, said first logic block and said first inverted-logic block being connected between a first power supply with a potential of V1 and a reference potential;
a second logic circuit which has a different logic function from that of said first logic circuit, the second logic circuit having a second input terminal and comprising a second logic block including a p-type FET with a threshold voltage of Vtp2 (Vtp2<Vtp1) and a second inverted-logic block including an n-type FET with a threshold voltage of Vtn2 (Vtn2<Vtn1), said second logic block and said second inverted-logic block being connected between a second power supply with a potential of V2 (V2<V1) and said reference potential; and
an output switch circuit which intervenes between said first logic block and said first inverted-logic block in said first logic circuit and between said second logic block and said second inverted-logic block in said second logic circuit and which has a control signal terminal to which a control signal is inputted and an output terminal from which one of an output of said first logic circuit and an output of said second logic circuit is outputted according to said control signal.

13. The semiconductor integrated circuit according to claim 12, wherein said output switch circuit outputs a constant potential.

14. The semiconductor integrated circuit to claim 12, wherein said output switch circuit switches one of said first logic circuit and said second logic circuit to a low impedance and the other to a high impedance and outputs said output of said one of said first logic circuit and said second logic circuit switched to said low impedance to said output terminal.

15. The semiconductor integrated circuit according to claim 12, wherein said output switch circuit includes a first switching p-type FET and a first switching n-type FET connected in series between said first logic block and said first inverted-logic block in said first logic circuit, and a second switching p-type FET and a second switching n-type FET connected in series between said second logic block and said second inverted-logic block in said second logic circuit, a connection node of said first switching p-type FET and said first switching n-type FET and a connection node of said second switching p-type FET and said second switching n-type FET being connected to said output terminal, and when said first switching p-type FET and said first switching n-type FET are on according to said control signal said second switching p-type FET and said second switching n-type FET are off, and when said first p-type FET and said first n-type FET are off, said second p-type FET and said second n-type FET are on.

16. The semiconductor integrated circuit according to claim 15, wherein said control signal to switch the output is inputted to gates of said first switching p-type FET and said second switching n-type FET and an inverted signal of said control signal is inputted to gates of said first switching n-type FET and said second switching p-type FET.

17. The semiconductor integrated circuit according to claim 12, wherein said output switch circuit is composed of a first switch circuit where a first p-type FET and a first n-type FET are connected in series between said first logic block and said first inverted-logic block in said first logic circuit, a connection node of said first p-type FET and said first n-type FET being connected to said output terminal, and a second switch circuit where a second and a third n-type FET are connected in series between said second logic block and said second inverted-logic block in said second logic circuit, a connection node of said second and said third n-type FET being connected to said output terminal, and when each of said FETs in one of said first switch circuit and said second switch circuit is on according to said control signal, each of said FETs in the other switch circuit is off.

18. The semiconductor integrated circuit according to claim 17, wherein said control signal is inputted to gates of said first p-type FET of said first switch circuit and said second and said third n-type FET of said second switch circuit and an inverted signal of said control signal is inputted to a gate of said first n-type FET of said first switch circuit.

* * * * *